United States Patent [19]

McCombs

[11] Patent Number: 4,669,101

[45] Date of Patent: May 26, 1987

[54] HIGH SPEED COUNTER WITH DECODING MEANS AND MEANS FOR SELECTING SECOND AND HIGHER ORDER COUNTER STAGES TO BE TOGGLED

[75] Inventor: Craig C. McCombs, Wichita, Kans.

[73] Assignee: NCR Corporation, Dayton, Ohio

[21] Appl. No.: 806,984

[22] Filed: Dec. 16, 1985

[51] Int. Cl.[4] ............................................. H03K 21/16
[52] U.S. Cl. ................................. 377/114; 377/116; 377/41; 307/272 A
[58] Field of Search ................. 377/114, 115, 116, 47, 377/48, 77, 41; 307/480, 272 A

[56] References Cited

U.S. PATENT DOCUMENTS

| | | | |
|---|---|---|---|
| 2,816,223 | 12/1957 | Nelson | 377/116 |
| 2,848,166 | 8/1958 | Wagner | 377/41 |
| 4,072,904 | 2/1978 | Casner et al. | 377/107 |
| 4,291,241 | 9/1981 | Mayama et al. | 307/480 |
| 4,408,336 | 10/1983 | Dasgupta | 377/116 |

*Primary Examiner*—John S. Heyman
*Assistant Examiner*—Karl Ohralik
*Attorney, Agent, or Firm*—Wilbert Hawk, Jr.; Edward Dugas; Floyd A. Gonzalez

[57] ABSTRACT

A counter for counting clock pulses and having a plurality of output bits successively numbered from a first output bit to a highest output bit. The counter includes a plurality of bistable devices, one bistable device being associated with each output bit, and each bistable device including a clock input for receiving clock pulses to be counted, and an output for providing one of the output bits and its complement. The bistable device which is associated with the first output bit toggles with the receipt of each clock pulse to be counted. The counter also includes a decode section responsive to the outputs of the plurality of bistable devices for providing decoded signals, and a select section for receiving the clock pulses to be counted and responsive to the decoded signals and the complement of the first output bit. The select section selects which of the plurality of bistable devices associated with the second and higher output bits will toggle on the receipt of the next clock pulse. The plurality of bistable devices, the decode section, and the select section operate in parallel with one another.

9 Claims, 5 Drawing Figures

HIGH SPEED COUNTER WITH DECODING MEANS AND MEANS FOR SELECTING SECOND AND HIGHER ORDER COUNTER STAGES TO BE TOGGLED

BACKGROUND OF THE INVENTION

The present invention relates to the design of high speed counters, and more particularly relates to high speed counters having feed back paths for determining the next output count based upon the present count.

All counters which count the occurrence of electrical impulses, such as clock pulses, in a binary fashion have a plurality of binary output signals whose state toggles, or changes from one signal level to its complement, in a set sequence upon the receipt of the next electrical impulse. High speed counters are known in which the state of the output signals are fed back to circuitry in the counter to determine which of the output signals should be toggled with the receipt of the next electrical impulse to be counted, such that the correct counting sequence may be maintained.

U.S. Pat. No. 3,064,890 by Butler, issued Nov. 20, 1962 for "Parallel Input Fast Carry Binary Counter with Feedback Resetting Means," discloses a high speed circuit having a feedback means and bistable elements, wherein the counter counts in sequence from 0 to $N-1$, and then recycles back to 0.

U.S. Pat. No. 3,517,318 by McDermond, issued June 23, 1970 for "Synchronous Counter," discloses a counter having a plurality of cascaded binary stages each of which, except the first, is driven by the previous stages and an input source through a NAND gate.

U.S. Pat. No. 3,706,043 by Reinert, issued Dec. 12, 1972 for "Synchronous Parallel Counter With Common Steering Of Clock Pulses To Binary Stages," discloses a parallel counter constructed as an integrated circuit with a plurality of pairs of NAND gates forming binary stages, and a steering circuit including input NAND gates associated with the binary stages. The steering circuit includes coupling from the outputs of the binary stages to the inputs of the higher order input NAND gates, and also couplings from the outputs of the input NAND gates to reset inputs of the lower order binary stages.

U.S. Pat. No. 3,753,127 by Rowe, issued Aug. 14, 1973 for "Pseudosynchronous Counter," discloses a counter which uses ripple counters, and provides a synchronous output through the use of a buffer stage which is loaded at the end of a clock pulse at which time the count will have settled down.

U.S. Pat. No. 3,849,635 by Freedman, issued Nov. 19, 1974 for "High Speed Programmable Counter" discloses a high speed counter wherein final counts of a cycle are counted in an auxiliary counter to provide time for presetting stages in the counter.

U.S. Pat. No. 4,433,372 by Eichrodt et al., issued Feb. 21, 1984 for "Integrated Logic MOS Counter Circuit," discloses a multi-stage logic circuit having gates to produce carry signals between stages, where the gates which transfer the carry signals are designed as transfergates.

U.S. Pat. No. 4,464,774 by Jennings, issued Aug. 7, 1984 for "High Speed Counter Circuit," discloses a counter circuit having feedback latches in cascade, and which monitors a carry-in signal for selectively causing the latchs to toggle.

SUMMARY OF THE INVENTION

A counter of the present invention for counting clock pulses and having a plurality of output bits successively numbered from a first output bit to a highest output bit is disclosed. The counter includes a plurality of bistable devices, one bistable device being associated with each output bit, and each bistable device including a clock input for receiving clock pulses to be counted, and an output for providing one of the output bits and its complement. The bistable device which is associated with the first output bit toggles with the receipt of each clock pulse to be counted. The counter also includes a decode section responsive to the outputs of the plurality of bistable devices for providing decoded signals, and a select section for receiving the clock pulses to be counted and responsive to the decoded signals and the complement of the first output bit. The select section selects which of the plurality of bistable devices associated with the second and higher output bits will toggle on the receipt of the next clock pulse. The plurality of bistable devices, the decode section, and the select section are aranged in a plurality of data channels.

One of the objects of the present invention is to provide a high speed counter wherein output bits of the counter are decoded and selected to be toggled to provide the next count in separate and parallel operations to increase the speed of the counter.

Another object of the present invention is to provide a high speed counter having an output section, a decode section, and a select section, wherein the nth count is provided by the output section, the $n+1$ count is provided by the select section and the $n+2$ count is provided by the decode section.

Another object of the present invention is to provide a high speed counter which may be fabricated on a single CMOS integrated circuit chip.

These and other objects of the present invention will become apparent from the drawings and the preferred embodiment disclosed herein.

DESCRIPTION OF THE PREFERRED EMBODIMENT

Figure 1:
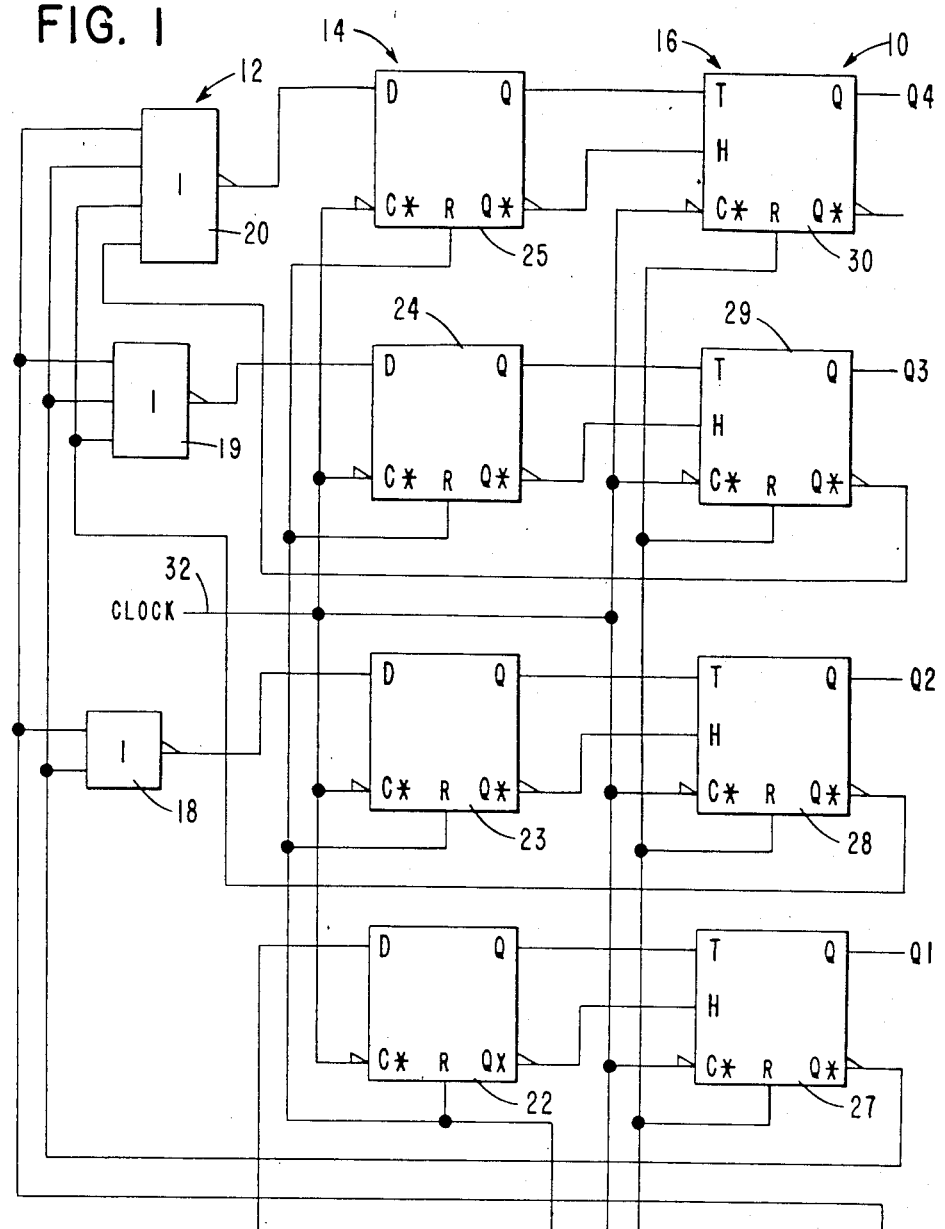
FIG. 1 is a schematic diagram of a counter of the present invention.

FIG. 1 is a schematic diagram of a counter 10 of the present invention. The illustrated counter 10 has five output bits Q0-Q4, each from a data channel. It will be understood that more or less output bits may be provided, as desired. The counter 10 includes a decode section 12, a select section 14, and an output section 16. The decode section 12 includes multiple input NOR gates 18, 19 and 20; the select section 14 includes D type flip-flop 22, 23, 24 and 25; and the output section 16 includes a D type flip-flop 26, and toggle flip-flops 27, 28, 29 and 30. The Q output of the D type flip-flop 26 provides the least significant bit Q0 of the counter 10, and the Q outputs of the toggle flip-flops 27, 28, 29 and 30 provide the bits Q1, Q2, Q3 and Q4, respectively, of the counter 10.

A CLOCK signal is inputted to the counter 10 at 32, and is connected to the clock terminal C* of the D type flip-flop 22-26 and the clock terminals C* of the toggle flip-flops 27-30. A RESET signal is inputted to the counter at 34, and is connected to the reset terminal R of each of the D type flip-flops 22-26 and the reset terminal R of the toggle flip-flops 27-30. It will be understood that each pulse of the CLOCK signal at 32 will cause the numeric value of the bits Q0-Q4 to increment by one in binary counting fashion, and that a positive RESET signal at 34 will reset the flip-flops 22-30 of the counter 10 such that all of the counter bits Q0-Q4 will be reset to 0.

The inverted or Q* output of the D type flip-flop 26 is connected to its own D input and to the D input of the D type flip-flop 22. The Q output of the D type flip-flop 26 is connected to one of the inputs of each of the NOR gates 18, 19 and 20. The Q* output of the toggle flip-flop 27 is connected to one input of each of the NOR gates 18, 19 and 20; the Q* output of the toggle flip-flop 28 is connected to one of the inputs of each of the NOR gates 19 and 20; and the Q* output of the toggle flip-flop 29 is connected to one input of the NOR GATE 20. The outputs of the NOR gates 18, 19 and 20 are connected to the D inputs of the D type flip-flops 23, 24 and 25, respectively. The Q outputs of the D type flip-flops 22-25 are each connected to the toggle input T of the toggle flip-flops 27-30, respectively; and the inverted or Q* outputs of the D type flip-flops 22-25 are each connected to the hold input H of the toggle flip-flops 27-30, respectively.

Figure 2:
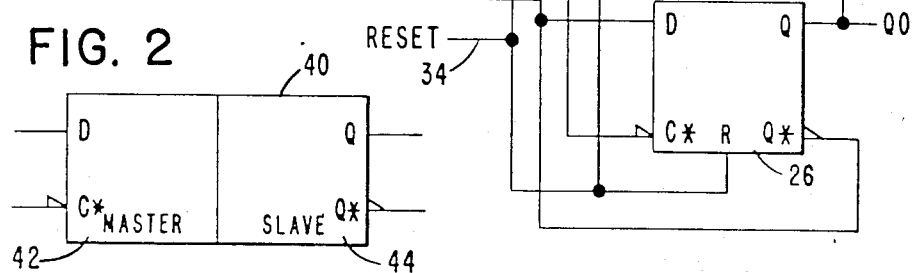
FIG. 2 is a diagramatic representation of a flip-flop usable with the counter of FIG. 1.

Before discussing the operation of the counter 10, the operation of the flip-flops of FIG. 1 will be discussed. FIG. 2 is a diagramatic representation of a flip-flop 40 usable with the counter 10. The flip-flop 40 illustrated in FIG. 2 is a D type flip-flop, and includes a master section 42 and a slave section 44. The master section 42 has a data terminal D for receiving data, and a clock terminal C for receiving a clock signal. When a clock signal, for instance the falling edge of a clock pulse, is received at the clock terminal C, the data in the form of a voltage level on the data terminal D is latched into a latching mean (not shown) in the master section 42. The data is then sent by the master section 42 to the non-inverted or Q output of the slave section 44, and the data complement is placed on the inverted or Q* output of the slave section 44. The data and its complement are then held by the slave section 44 on its Q and Q* output terminals, respectively, until a new negative going edge is placed on the clock input C of the master section 42. Such master-slave flip-flops are well known in the art.

Figure 3:
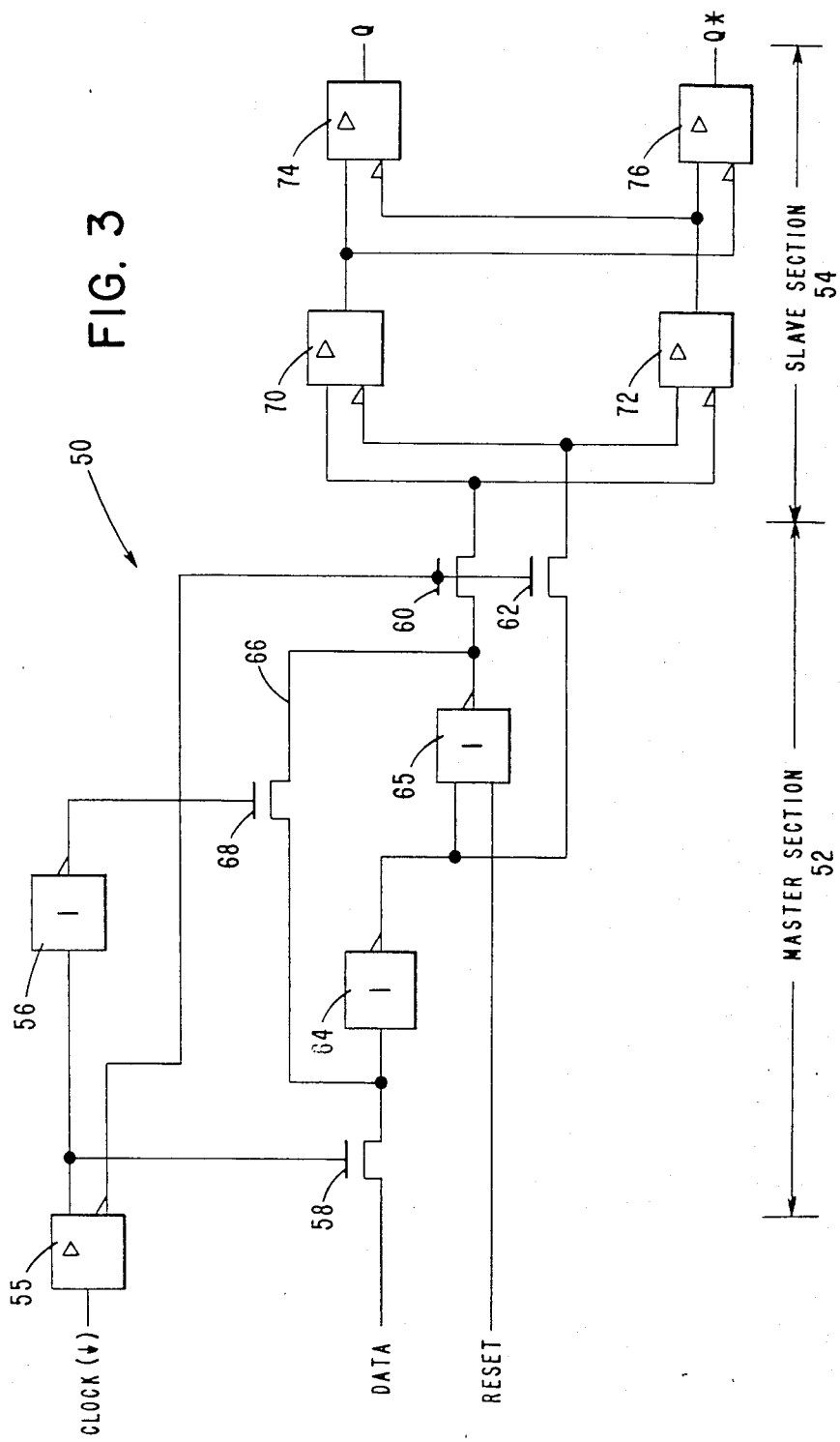
FIG. 3 is a logic schematic diagram of a D type flip-flop usable with the counter of FIG. 1.

FIG. 3 is a logic schematic diagram of a D type flip-flop 50 which may be used for D type flip-flops 22-26 of FIG. 1. The D type flip-flop 50 is divided into a master section 52 and a slave section 54. The master section 52 of flip-flop 50 includes a clock driver 55 having an input for receiving a CLOCK signal, which is the same as the CLOCK signal of FIG. 1, a non-inverted output connected to the input of an inverter 56 and the gate of a pass transistor 58, and an inverted output connected to the gates of pass transistor 60 and 62. The pass transistor 58 controls the inputting of the DATA signal to the input of an inverter 64. The output of inverter 64 is connected to one input of a NOR gate 65, which acts as an inverter when the RESET signal on its other input is low. A feedback conductor 66 is provided for feeding the signal outputted from the NOR gate 65 to the input of the inverter 64. Signal transmission over the feedback conductor 66 is controlled by a pass transistor 68, whose gate is connected to the output of the inverter 56.

The outputs of the inverter 64 and the NOR gate 65 are connected, through pass transistors 60 and 62 respectively, to a pair of output driver amplifiers 70 and 72 of the slave section 54. The output driver amplifiers 70 and 72 are cross-connected such that they will have complementary outputs based upon signals from the outputs of inverter 64 and NOR gate 65. The outputs of the output driver amplifiers 70 and 72 are connected to the inputs of a second pair of output driver amplifiers 74 and 76, whose outputs provide the Q and Q* outputs of the flip-flop 50.

The inverter 56 provides a slow low-to-high transition, and a fast high-to-low transition. It will be understood that when the frequency of the clock pulses of the CLOCK signal is high enough, the signal output from the inverter 56 does not have time to go high, and thus the pass transistor 68 will stay turned off. This opens the feedback loop formed by the conductor 66 such that the flip-flop 50 acts as a dynamic flip-flop. However, when the frequency of the clock pulses is not sufficiently high, or there are no clock pulses, there is sufficient time for the output of the inverter 56 to go high during the time when the non-inverted output of the amplifier 55 is low, thus turning on pass transistor 68 and closing the feedback loop formed by conductor 66. In this instance, the flip-flop 50 acts as a static flip-flop.

It will thus be seen that when a low CLOCK signal is inputted into the amplifier 55, the pass transistor 58 is turned off such that the condition of the DATA signal is stored on the input of the inverter 64. Also, the pass transistors 60 and 62 are turned on, such that the stored condition of the DATA signal is passed via pass transistor 60 and the inverted condition is passed via pass transistor 62 to simultaneously determine the Q and Q* outputs of the flip-flop 50, dependent on the stored condition of the DATA signal.

Figure 4:
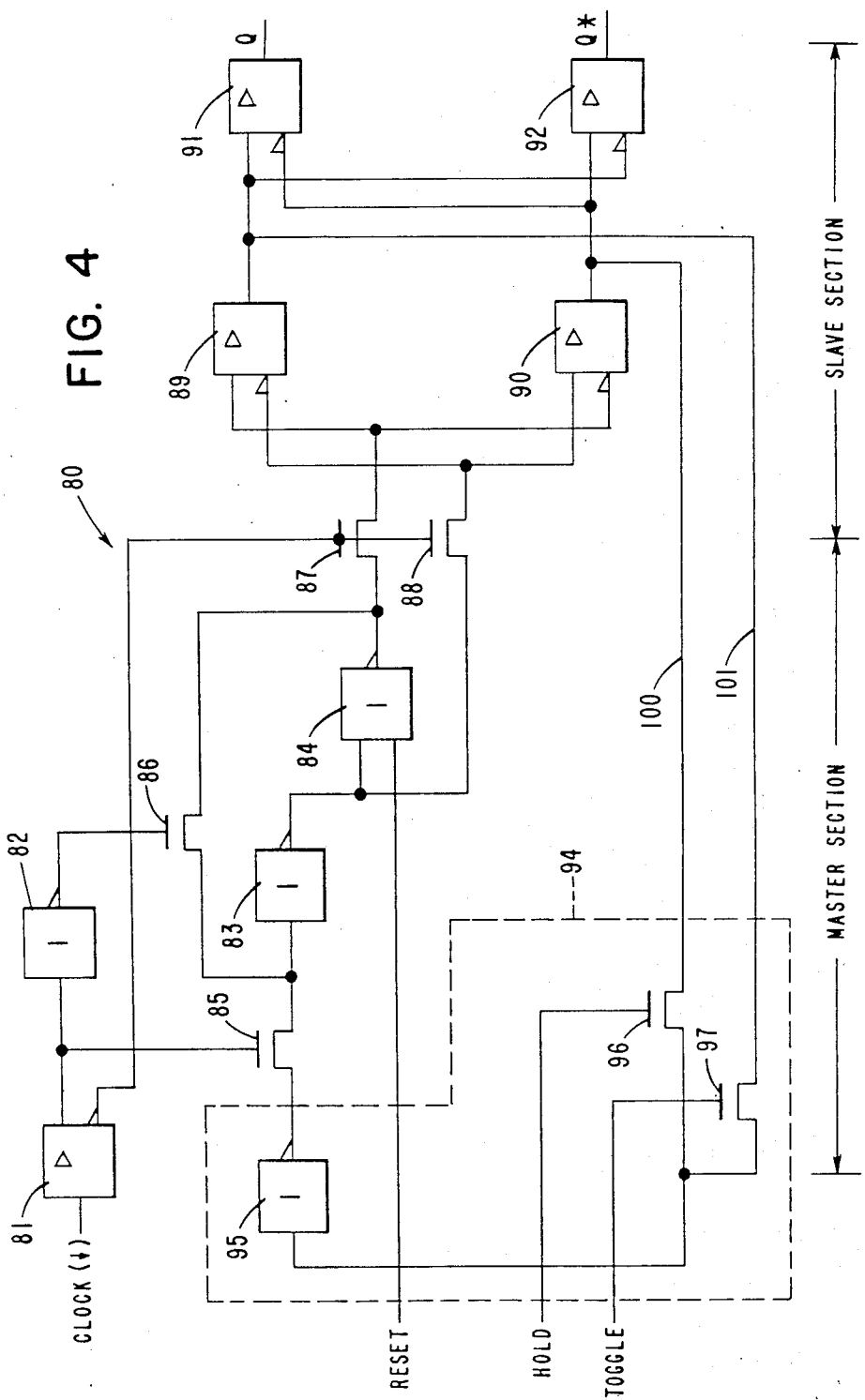
FIG. 4 is a logic schematic diagram of a toggle flip-flop usable with the counter of FIG. 1.

FIG. 4 is a logic schematic diagram of a toggle flip-flop 80 which may be used for the toggle flip-flops 27-30 of FIG. 1. The toggle flip-flop 80 includes a clock driver 81, inverters 82 and 83, NOR gate 84, pass transistors 85, 86, 87 and 88, a first pair of output driver amplifiers 89 and 90, and a second pair of output drivers 91 and 92, all connected similar to the corresponding elements of the D type flip-flop 50, as discussed in connection with FIG. 3. The toggle flip-flop 80 also includes a control circuit 94 which senses the conditions of a TOGGLE signal and a HOLD signal, and toggles or holds the Q and the Q* outputs of the output driver amplifiers 91 and 92, respectively, based on the sensed conditions.

The control circuit 94 includes an inverter 95, a pass transistor 96 having its gate for receiving a HOLD signal (shown as the H terminals of the flip-flops 27-30 of FIG. 1) and a pass transistor 97 having its gate for receiving a TOGGLE signal (shown as the T terminals of the flip-flops 27-30 of FIG. 1). A feedback loop is provided over conductor 100 from the output of output driver amplifier 90 to the inverter 95 via pass transistor 96. A second feedback loop is provided over conductor 101 from the output of the output driver amplifier 89 to the inverter 95 via pass transistor 97.

To understand the operation of the flip-flop 80 of FIG. 4, assume that a high is placed on the input of inverter 83, and that a negative going edge of a clock pulse of the CLOCK signal has been received by the clock driver 81. In that case, a high will be placed on the output of NOR gate 84, assuming that the RESET signal is low, and passed by pass transistor 87. Also, the low on the output of inverter 83 will be passed by pass transistor 88. The output of the output driver amplifier 89 will be high, and output of output driver amplifier 90 will be low, such that the conductor 100 and the Q output of the flip-flop 80 will be high and the conductor 101 and the Q* output will be low. If the TOGGLE signal is high and the HOLD signal is low, the high on conductor 101 will be transmitted via pass transistor 97 to the inverter 95, to place a low on the input of the inverter 83 at the next clock pulse of the CLOCK signal, thus causing the flip-flop 80 to toggle. If the TOGGLE signal is low and the HOLD signal is low, the low on conductor 100 will be transmitted via pass transistor 96 to the inverter 95, to keep a high on the input of the inverter 83 at the next clock pulse of the CLOCK signal, causing the flip-flop 80 to hold.

Returning to FIG. 1, decode section 12 decodes the output bit Q0 and the complements of the output bits Q1-Q3 to provide control signals to the select section 14. The select section 14 selects which of the current bits Q0-Q4 are to be toggled on the next clock. The output section 16 provides the output bits Q0-Q4 from flip-flops 26-30 which are toggled in the correct sequence such that the values of the output bits Q0-Q4 are incremented in a binary fashion with each clock pulse. On the nth pulse after a reset, the value of the binary bits Q0-Q4 of the output section 16 is equal to n, the select section 14 is set such that it will select the bits Q0-Q4 to be toggled to give the value of n+1 on the n+1 clock, and the decode section 12 is set so as to control the select section 14 to give the correct n+2 value on the n+2 clock.

When the RESET signal at 34 goes high, the flip-flops 22-30 are reset such that in every case, their Q outputs go low and their Q* outputs go high. This makes all of the output bits Q0-Q4 go low. Responsive to a reset, the low at the Q output of the D type flip-flop 26 is placed on one input of all the NOR gates 18, 19 and 20; the high at the Q* output of the toggle flip-flop 27 is placed on one input of the NOR gates 18, 19, 20; the high on the Q* output of the toggle flip-flop 28 is placed on one input of the NOR gates 19 and 20; and the high at the Q* output of toggle flip-flop 29 is placed on one input of the NOR gate 20. Since at least one of the inputs of all of the NOR gates 18, 19 and 20 is high, the outputs of the NOR gates 18, 19 and 20 are low. Thus, after a reset, the counter 10 is conditioned such that all of the output bits Q0-Q4 are 0, and the counter is ready to start counting on the next received CLOCK pulse.

When the CLOCK signal at 32 goes low, all of the D type flip-flops 22, 23, 24, 25 and 26 latch the voltage levels at their respective D terminals, and respectively place the latched voltage levels on their Q outputs, and the complement of the latched voltage levels on their Q* outputs. When the voltage level on the toggle inputs T of a toggle flip-flop is low and the voltage level on its hold inputs H is high (as is the case for all of the toggle flip-flops 27-30 just after the counter 10 is reset) the toggle flip-flop will hold its outputs Q and Q* in the same condition. However, when the T input of a toggle flip-flop is high, and its H input is low (as explained in connection with FIG. 4) the toggle flip-flop will "toggle" such that the voltage levels on its Q and Q* outputs will be changed to their complementary voltage levels.

Since the D terminals of the D type flip-flops 22 and 26 are connected to the Q* output of the D type flip-flop 26, they will always toggle with the receipt of each CLOCK pulse at 32. As explained in connection with FIG. 2, the receipt of a negative going edge of a CLOCK pulse at 32 will latch the voltage levels on inputs of the flip-flops 22-26 into their master sections Also, the receipt of a negative going edge of clock pulse at 32 will latch the voltage level on either the Q or Q* output of flip-flops 27-30, dependent on the state of the respective T and H inputs, into their master sections via their control circuits 94, as discussed in connection with FIG. 4. The respective slave sections of the flip-flops 22-26 are then changed dependent upon the latched voltage levels in their master sections. Thus, each flip-flop 22-30 is able to remember the voltage levels on either their inputs or outputs when the negative going edge of a clock pulse was received, without being affected by a subsequent change in the output of a previous element after the latching has occurred.

At the receipt of the first CLOCK pulse at 32, all of the flip-flops 22-30 will latch the correct voltage levels as explained. Since lows were on the T terminals and highs on the H terminals of the toggle flip-flops 27-30, the toggle flip-flops will hold their present condition and the bits Q1-Q4 will remain 0's. However, D type flip-flop 26 will toggle, as previously explained, and the Q0 bit will go high, or to its 1 value. Since the inputs to the D terminals of D type flip-flops 22-25 are low, the conditions of the D type flip-flops 23-25 will remain the same. However, as previously explained, the D type flip-flop 22 will toggle, which selects the toggle flip-flop 27 to toggle on the next CLOCK. Also, the low on the Q output of D type flip-flop 26 will be placed on one input of each of the NOR gates 18, 19 and 20. However, since the voltage inputs on the other inputs are all high, the outputs of the NOR gates 18, 19 and 20 will remain low. Thus, after the first CLOCK pulse after a RESET, the value on the output of the counter 10 will be equal to 1.

On the receipt of the second CLOCK pulse at 32, the toggle flip-flop 27 will toggle because D type flip-flop 22 was toggled on the last CLOCK pulse. Also, D type flip-flops 22 and 26 will again toggle. this changes the Q0 bit to a low or 0, and the Q1 bit to a high or 1. Now, both inputs to the NOR gate 18 will go low, causing the output of the NOR gate 18 to go high. It will be seen that this high will be propagated through the D type flip-flop 23 as an instruction to the toggle flip-flop 28 to toggle after two more clock pulses. Since at least one other input to the NOR gates 19 and 20 remain high, the outputs of NOR gates 19 and 20 remain low. The toggling of the D type flip-flop 22 now places a low on the T input of the toggle flip-flop 27, and a high on its H input, instructioning the toggle flip-flop to hold is current values on the next clock. The value of bits Q0-Q4 of the counter 10 after the second CLOCK is equal to 2, with the output of the D type flip-flop 22 instructing the toggle flip-flop 27 to hold on the first subsequent CLOCK pulse, and the output of the NOR gate 18 at a high such that the toggle flip-flop 28 will toggle on the second subsequent CLOCK pulse.

By tracing the logic of the counter 10 in a similar fashion, it will be seen that on the receipt of the third CLOCK at 32, the D type flip flop 26 will toggle and the toggle flip-flop 27 will hold, making both of the output bits Q0 and Q1 high, giving the output of the counter 10 a value equal to 3. The D type flip-flop 22 will toggle such that at the next CLOCK, the toggle flip-flop 27 will also toggle. Since the input of NOR gate 18 connected to the Q output of the D-type flip-flop 26 goes high, the output of NOR gate 18 will again go low.

On the receipt of the fourth CLOCK pulse at 32, toggle flip-flop 28 toggles making output bit Q2 high, toggle flip flop 27 toggles making output bit Q1 low, and D type flip-flop 26 toggles making output Q0 low. Thus, the output of the counter 10 has a value equal to 4. Also, D type flip-flop 23 toggles and D type flip-flop 22 toggles such that on the next CLOCK pulse, the toggle flip-flops 27 and 28 will hold their present conditions.

By continuing to follow the logic of the counter 10 in a similar fashion, it will be seen that the counter 10 counts sequentially in a binary fashion until all of the output bits Q0–Q4 are high, or until the counter 10 is again reset as explained. It will be seen that the speed of the counter is limited by the speed at which the output of the devices 18–20 and 22–25 become stable, the speed of the flip-flops 22–30 in latching the data, and the speed of the flip-flops 22–30 in placing the latched data on their outputs. In the counter 10, the next state of the output bits Q0–Q4 is determined by first decoding the present state, and then using this information to select which output bits of the current count will be toggled on the next clock. By dividing these two function into separate but parallel operations, the speed of the counter 10 is greatly increased.

It will be recognized that the D type flip-flop 22 performs the same function as the D-type flip-flop 26. However, D type flip-flop 22 is included to increase the speed of the control of toggle flip-flip 27.

If the devices of the counter 10 are placed in a single integrated circuit, well known 3 micron gate NMOS VLSI techniques may be used to fabricate the entire circuit of FIG. 1 onto a single chip, either alone or as a component of a larger circuit. A high speed counter has been built in a single NMOS VLSI circuit chip wherein the D type flip-flops and toggle flip-flops have been fabricated as disclosed in FIGS. 3 and 4. This high speed counter is a part of a data separater chip available from NCR Corporation under the part number 006-1082085.

Figure 5:
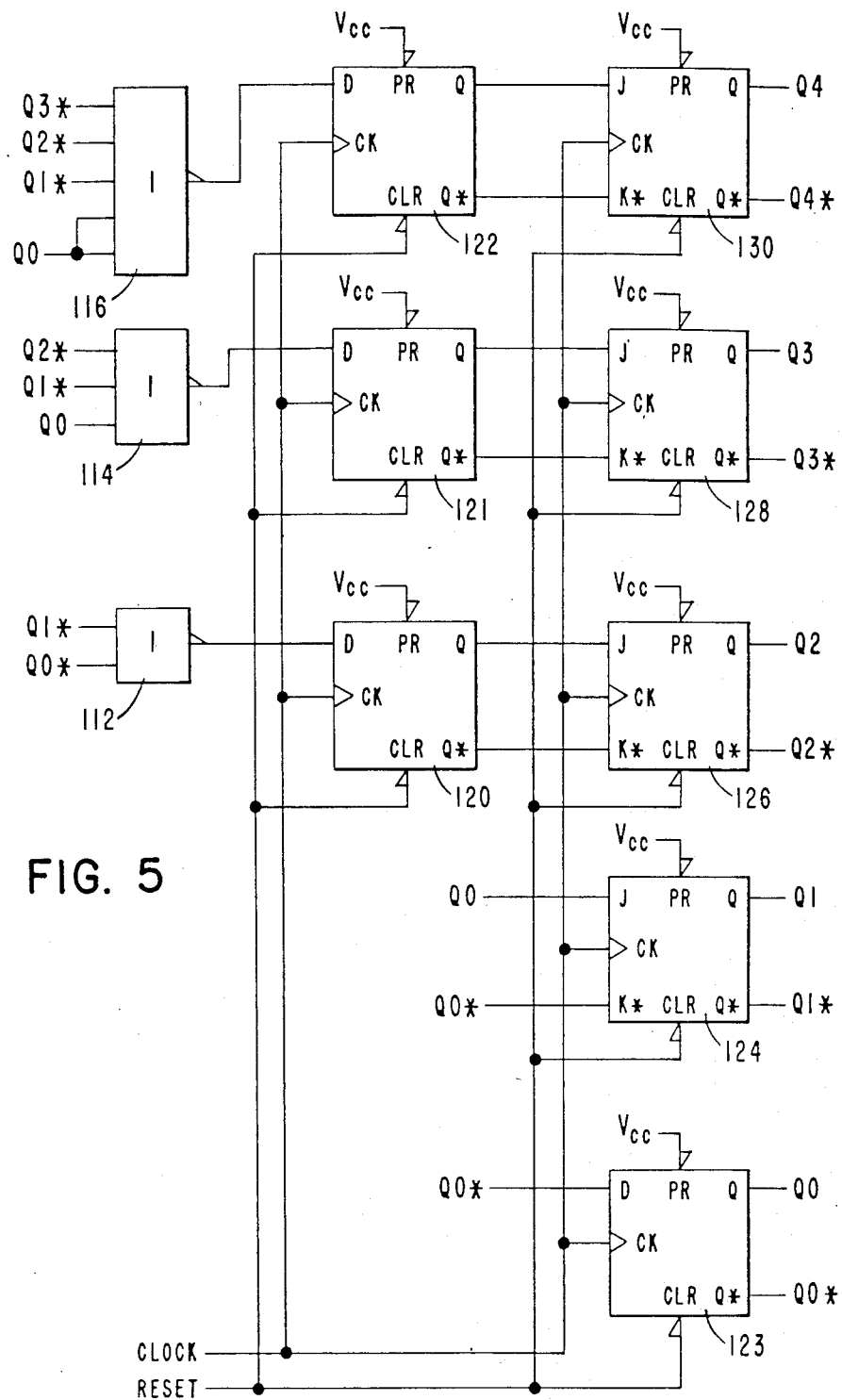
FIG. 5 is a schematic diagram of a high speed counter made of discrete components.

FIG. 5 is a schematic diagram of a counter 110 which may be made of discrete components. Some connecting lines have been left out for clarity. It will be understood that like labeled terminals are connected throughout FIG. 5. NOR gate 112, NOR gate 114 and NOR gate 116 may be 74S02, 74S27 and 74S260 devices, respectively, available from Texas Instruments. D type flip-flops 120, 121, 122 ad 123 may be 74S74 flip-flops available from Texas Instruments. J-K* flip-flops 124, 126, 128 and 130 may be 74S109 flip-flops available from Texas Instruments. Also, registers such as 74S174 devices available from Texas Instruments may be substituted for the D type flip-flops 120–123. It will be noted that the flop-flop corresponding to flip-flop 22 of FIG. 1 has been omitted in the circuit of FIG. 5.

Thus, a counter has been described which provides the aforementioned objects. It will be understood by those skilled in the art that the disclosed embodiment is exemplary only, and that various elements disclosed may be replaced by equivalents without departing from the invention hereof, which equivalents are intended to be covered by the appended claims.

What is claimed is:

1. A counter for counting clock pulses and having a plurality of output terminals successively arranged from a first output terminal to a highest output terminal, said counter comprising:
   a plurality of bistable devices, each bistable device including clock input means for receiving clock pulses to be counted, and output means for providing an output bit to one of said output terminals and the complement of its output bit to other output terminals, the bistable device of the first output terminal toggling with the receipt of each clock pulse to be counted;
   a decode section responsive to outputs provided by the output means of said plurality of bistable devices for providing decoded signals; and
   a select section having means for receiving said clock pulses to be counted and responsive to said decoded signals and the complement of the output bit on said first output terminal, said select section for selecting which of said plurality of bistable devices of the second and higher output terminals will toggle on the receipt of the next clock pulse;
   said plurality of bistable devices, said decode section, and said select section being arranged in a plurality of data channels.

2. The counter of claim 1 wherein the bistable device of the first output terminal has a first output for providing an output bit, a second, negated output for providing the complement of its output bit, a data input connected to said second, negated output, and a clock input for receiving clock pulses to be counted; wherein each clock pulse received at said clock input causes said bistable device of the first output terminal to toggle.

3. The counter of claim 1 comprising a plurality of NOR gates, each having multiple inputs and an output for providing a decode signal, one of said NOR gates for each of the third and higher output terminals;
   said output means of the bistable device of the first output terminal being connected to one input of each of said NOR gates for providing the output bit of said first output terminal to each of said NOR gates; and
   each of said output means of the bistable devices of the second and higher other output terminals being connected, respectively, to all NOR gates of higher numbered output terminals for providing thereto, the complement of its output bit.

4. The counter of claim 3 wherein said select section comprises a plurality of select bistable devices, one of said select bistable devices for each of said NOR gates, and each of said select bistable devices having a clock input for receiving clock pulses to be counted and a data input connected to the output of its NOR gate.

5. The counter of claim 4 wherein said select section further comprises an additional select bistable device having a clock input for receiving said clock pulses to be counted, and a data input connected to the output means of the bistable device of the first output terminal for receiving the complement of its output bit.

6. The counter of claim 5 wherein the select bistable devices of said select section and the bistable device of the first output terminal are all D type flip-flops, each having a master section including a latching means for latching data on its data input responsive to a clock pulse on its clock input, and a slave section including a first output for providing data latched by its latching means, and a second, negated output for providing the complement of data latched by its latching means.

7. The counter of claim 6 wherein the bistable devices of the second and higher output terminals are toggle flip-flops, each of said toggle flip-flops having a toggle input connected to the first output of a respective one of said D type flip-flops of said select section, a hold input connected to the second, negated output of said respective one of said D type flip-flops of said select section, and a clock input for receiving clock pulses to be counted.

8. The counter of claim 7 wherein each of said toggle flip-flops includes a master section having a control means for sensing the condition of its respective toggle and hold inputs responsive to said clock pulse on its clock input; and a slave section having a first output for providing an output bit responsive to said clock pulse, and a second, negated output for providing the complement of its output bit to the decode section;

each of said toggle flip-flops for toggling its outputs when the condition of its toggle input is high and the condition of its hold input is low, and for not toggling its outputs when the condition of its toggle input is low and the condition of its hold input is high.

9. The counter of claim 8 wherein said toggle flip-flops and said D type flip-flops each includes a reset input for receiving a reset pulse to reset said toggle flip-flops and said D type flip-flops such that all of the output bits of the output terminals of the counter are reset to their zero condition.

* * * * *